(12) United States Patent
Vest et al.

(10) Patent No.: US 7,132,852 B2
(45) Date of Patent: Nov. 7, 2006

(54) ROUTING ARCHITECTURE WITH HIGH SPEED I/O BYPASS PATH

(75) Inventors: William Bradley Vest, San Jose, CA (US); Paul Leventis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/825,387

(22) Filed: Apr. 14, 2004

(65) Prior Publication Data

US 2005/0231236 A1    Oct. 20, 2005

(51) Int. Cl.
*H03K 19/173*    (2006.01)

(52) U.S. Cl. .............................. 326/41; 326/37; 326/39; 326/47

(58) Field of Classification Search ............ 326/37–41, 326/47

See application file for complete search history.

(56) References Cited

U.S. PATENT DOCUMENTS

| | | | |
|---|---|---|---|
| 4,642,487 A | 2/1987 | Carter | 307/465 |
| 5,317,210 A * | 5/1994 | Patel | 326/40 |
| 5,359,536 A | 10/1994 | Agrawal et al. | |
| 5,740,069 A * | 4/1998 | Agrawal et al. | 716/16 |
| 6,069,490 A | 5/2000 | Ochotta et al. | 326/41 |
| 6,366,120 B1 * | 4/2002 | Schleicher et al. | 326/41 |
| 6,407,576 B1 | 6/2002 | Ngai et al. | 326/41 |

* cited by examiner

*Primary Examiner*—Anh Q. Tran
(74) *Attorney, Agent, or Firm*—Fish & Neave IP Gro Ropes & Gray LLP; Robert R. Jackson; Chia-Hao La (57) ABSTRACT

Improved routing architectures including one or more high speed input/output (I/O) bypass paths are provided for use in, for example, programmable logic devices (PLDs) such as field programmable gate arrays (FPGAs). The output bypass paths add additional routing connections to the routing architecture, providing faster connections between the output of a logic element (LE) in the PLD and external circuitry. In one embodiment, an output bypass path is used for directly connecting the output of the LE to the input of an I/O multiplexer of an I/O block. In another embodiment, the output bypass path also bypasses the I/O multiplexer, providing a direct connection between the output of the LE and a bypass multiplexer of the I/O block. Also provided is an input bypass path which provides direct connections between an input buffer of the I/O block and an otherwise dangling conductor at the periphery of the PLD's routing architecture.

31 Claims, 10 Drawing Sheets

ROUTING ARCHITECTURE WITH HIGH SPEED I/O BYPASS PATH

BACKGROUND OF THE INVENTION

The present invention relates generally to routing architectures for use in, for example, programmable logic devices (PLDs). More particularly, this invention relates to improved routing architectures using one or more high speed input/output (I/O) bypass paths.

PLDs are well known as is shown, for example, by Jefferson et al. U.S. Pat. No. 6,215,326 and Ngai et al. U.S. Pat. No. 6,407,576. In general, a PLD is a general-purpose integrated circuit device that is programmable to perform any of a wide range of logic tasks. Instead of having to design and build separate logic circuits for performing different logic tasks, general-purpose PLDs can be programmed in various different ways to perform those different logic tasks. Many manufacturers of electronic circuitry and systems find the use of PLDs to be an advantageous way to provide various components of what they need to produce. For the purposes of this description, the term PLD encompasses any digital logic circuit configured by or for the end-user, and includes a programmable logic array (PLA), a field programmable gate array (FPGA), an erasable and complex PLD, and the like.

The basic building block of a PLD is a logic element (LE) that is capable of performing limited logic functions on a number of input variables. Each LE in a PLD typically provides a combinational logic function such as a look-up table (LUT), and one or more flip-flops. The input of the flip-flop may programmably be selected to be either the output of the LUT, or one of the input pins of the LE. Other multiplexing circuits may exist to dynamically select between the output of the LUT and one of the inputs of the LE using other logic signals. Moreover, each LE can programmably select as one of the outputs the output of the LUT, which is the combinational output, or the output of the flip-flop, which is the registered output.

To facilitate implementation of complex logic functions, LEs in a PLD are arranged in groups to form one or more logic array blocks (LABs). For example, each LAB in a PLD may include eight LEs, and the LAB may be programmed to provide any one of a plurality of logic functions by using control bits. The LABs in a PLD, meanwhile, are arranged in a one or two dimensional array and are programmably connectable to each other using a PLD routing architecture. The routing architecture of a PLD (e.g., an FPGA), moreover, typically includes an array of signal conductors having programmable interconnections which are used to route data and output enable signals. For example, the routing architecture may include several horizontal and vertical conductor channels, where each of these channels includes one or more horizontal or vertical signal conductors, respectively. Additionally, the conductors in a given channel may span all of the LABs in a given row or column, or rather, may span only a subset of the LABs in the row or column (e.g., 4 LABs). These types of conductors are generally referred to herein as segmented conductors.

The routing architecture of a PLD typically also includes internal conductors associated with (e.g., located inside) each LAB. Additionally, drive circuitry is used to provide inputs to the LEs and route outputs from the LEs to the conductors both within the LAB and outside the LAB. For example, a first set of internal conductors within a LAB may be driven by multiplexers (e.g., one associated with each LE) that select from routing signals outside the LAB, while a second set of internal conductors can be used to carry signals solely generated by LEs within a given LAB.

In order to allow external signals to enter the PLD for processing and to allow logic signals produced by the PLD to be applied to external circuitry, PLDs also include I/O circuitry. For example, a PLD may include I/O blocks and I/O pads for conveying signals from within the PLD to external circuits as well as from external circuits to within the PLD. These I/O blocks and I/O pads are typically arranged at the periphery of a chip, and include various connections to the routing architecture of the PLD. Moreover, in typical use, a portion of the I/O pads can be configured for input purposes and a different portion can be configured for output purposes. There may also be, for example, some pins associated with I/O pads 170 that are used as bidirectional pins which will dynamically change from input pins to output pins.

In many conventional PLDS, such as an FPGA, a signal traveling in either direction between an LE and an I/O pad passes through a number of components (e.g., multiplexers, signal conductors and programmable interconnections of signal conductors) to reach its destination. Meanwhile, each of these components adds a respective delay to the signal transfer process, sometimes resulting in a prohibitively large propagation delay (e.g., the pin-to-pin data transfer speed may not be fast enough to support certain applications) for the PLD.

SUMMARY OF THE INVENTION

In accordance with the principles of the present invention, improved routing architectures for use in PLDs (e.g., FPGAs) are provided that use one or more high speed I/O bypass paths. In particular, the use of input and output bypass paths to provide faster connections between LEs and external circuitry in highly multiplexed PLDs is described herein.

An output bypass path according to the principles of the present invention adds a direct connection between an LE output and I/O block circuitry in a PLD for reducing the delays associated with providing signals from the LE to circuitry external to the PLD. In one embodiment, the output bypass path is used for directly connecting the LE output to the input of an I/O multiplexer of the I/O block. In this manner, the delays associated with routing an LE output signal through one or more multiplexers, drivers and/or conductors are eliminated or at least significantly reduced. In another embodiment, the output bypass path provides a direct connection between the LE output and I/O block circuitry that also bypasses the I/O multiplexer. In particular, this output bypass path provides a direct connection between the LE output and an I/O block bypass multiplexer (which in this embodiment is necessary to select as its output the signal from either the I/O multiplexer or the output bypass path).

Also provided in accordance with the principles of the present invention is an input bypass path which provides direct connections between an input buffer of an I/O block and an otherwise dangling segmented conductor at the periphery, or boundary, of the PLD's routing architecture. Accordingly, the input bypass path eliminates or at least reduces the delays associated with using an input multiplexer and driver for routing a signal from the I/O block onto a signal conductor of the PLD routing architecture.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE INVENTION

Figure 1:
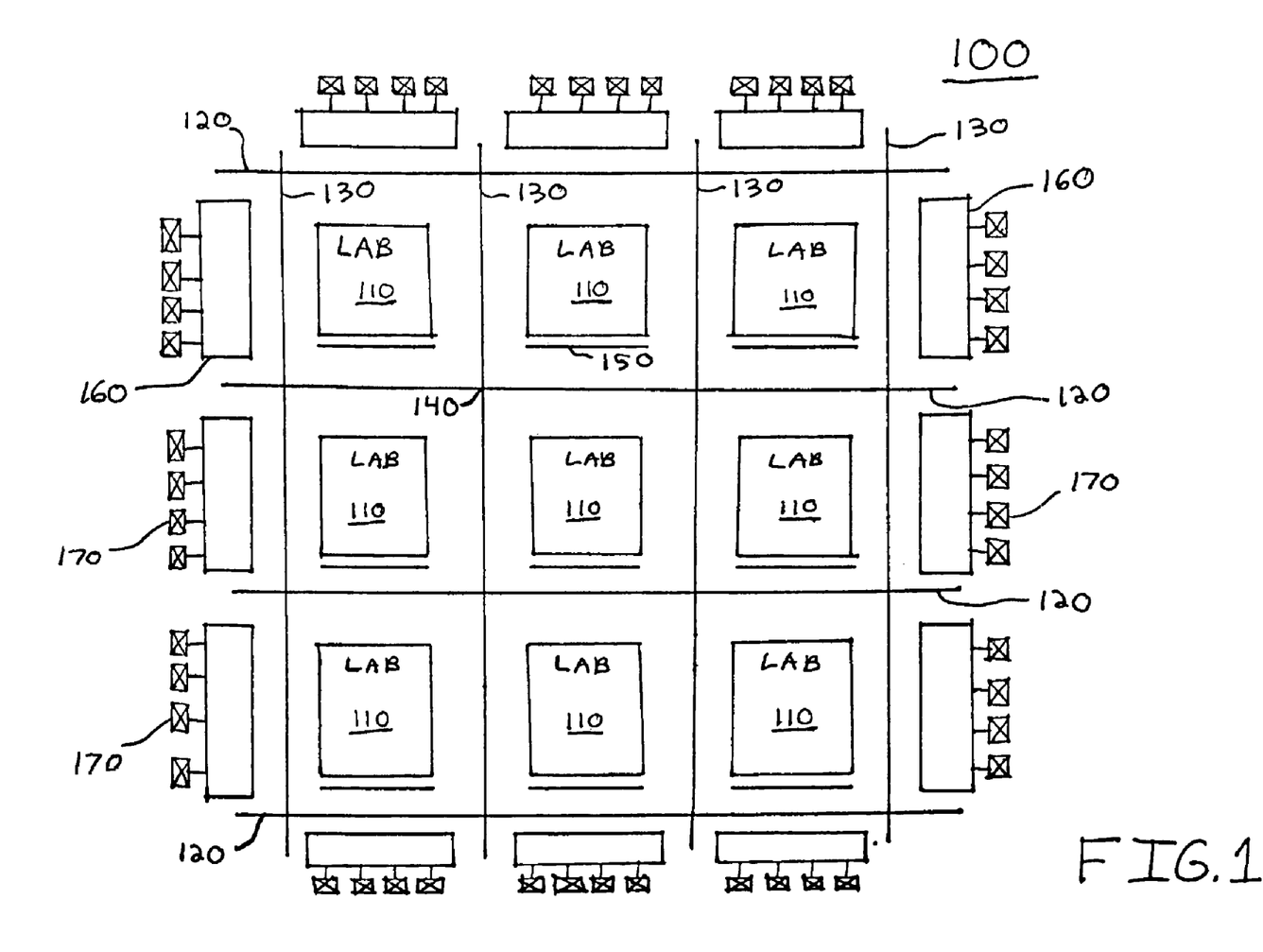
FIG. 1 is a simplified block diagram showing the overall routing architecture of a PLD incorporating the principles of present invention.

FIG. 1 is a simplified block diagram showing the overall routing architecture of a PLD 100 which incorporates the principles of present invention. Many details of PLD architecture, organization, and circuit design are well known and therefore not necessary to be shown or described for an understanding of the present invention. Such details have generally been omitted from FIG. 1 and the remaining figures described below for the purpose of simplifying the description of the present invention.

As illustrated in FIG. 1, PLD 100 includes a three-by-three two-dimensional array of nine LABs 110. However, PLD 100 may contain any arbitrary number of LABs 110 (e.g., more or less nine). Moreover, it will also be understood that LABs 110 need not be organized in a square matrix, or array, as illustrated in FIG. 1. Rather, for example, PLD 100 may include a one-by-nine matrix of LABs 110. The invention is not limited in either of these manners.

The routing architecture of PLD 100 includes an array of global horizontal (GH) channels 120 and global vertical (GV) channels 130. Although shown as single lines in FIG. 1, each GH channel 120 and GV channel 130 may represent a plurality of signal conductors. Meanwhile, each LAB 110 of PLD 100 shown in FIG. 1 has one or more inputs and outputs (not shown) which may or may not be programmably connected to the routing architecture of PLD 100. For example, the inputs and outputs of each LAB 110 may be programmably connectable to any or all of the conductors of an adjacent GH channel 120 and/or an adjacent GV channel 130. Using these channels, multiple LABs 110 may be connected and combined to implement larger, more complex logic functions than can be realized using only a single LAB 110.

In one embodiment, any or all of the conductors of GH channels 120 and GV channels 130 may or may not be programmably connectable at intersections 140. Namely, the conductors of various GH channels 120 and GV channels 130 may be programmably connected together at select interconnections 140 to create a signal path from the output of a LAB 110 at one location on PLD 100 to the input of one or more different LABs 110 at other locations on PLD 100. Additionally, using the routing architecture of PLD 100, signals from a LAB 110 can be fed back into the same LAB 110. It will therefore be understood that, in specific embodiments of the present invention, it may be possible for only select conductors in GH channels 120 to be programmably connectable to a selection of the conductors in GV channels 130. Furthermore, in still further embodiments, the conductors of GH channels 120 and GV channels 130 may be specifically used for passing signals in a specific direction, such as input or output, but not both.

As explained in greater detail below, PLD 100 may also include segmented conductors (not shown) in addition to or in place of GH channels 120 and GV channels 130. In this case, the segmented conductors span a specific number of LABs 110 and not necessarily an entire row or column of LABs as is the case with the conductors of GH channels 120 and GV channels 130. For example, the segmented conductors may span two, three, four, five, or more LABs 110 in a given row or column. For purposes of description herein, for example, a conductor that spans four horizontal LABs 110 will be described as an H4 conductor. Meanwhile, for example, a conductor that spans six vertical LABs 110 will be described herein as a V6 conductor.

In addition to the above, the routing architecture of PLD 100 can also include a plurality of local horizontal channels 150, each including one or more local horizontal conductors (not shown). In particular, as illustrated in FIG. 1, each LAB 110 may have associated with it a local horizontal channel 150 which includes, for example, one local horizontal conductor for each of the logic elements in that LAB 110. Local horizontal channels 150 can be used to convey signals solely between the logic elements (not shown) in a given LAB 110, and thus, do not extend beyond their respective LABs 110.

Moreover, in addition to local horizontal channels 150, PLD 100 may also include local vertical channels (not shown) associated with each LAB 110. These local vertical channels, which include one or more local vertical conductors that do not go outside their respective LABs 110, may be used to provide signals to the logic elements of each LAB 110. For example, assuming an LE of a LAB 110 includes a LUT, a local vertical channel may be used to provide the inputs to the look-up table from either the local horizontal channel 150 associated with the particular LAB 110 or from the GH channel 120 passing by the associated LAB 110.

As illustrated in FIG. 1, PLD 100 also includes I/O blocks 160 and I/O pads 170 at the peripheries of the chip. It will be understood that, while FIG. 1 shows twelve I/O blocks 160, a PLD in accordance with the principles of the present invention may contain any other suitable number of I/O blocks 160. Similarly, the number of I/O pads 170 associated with each I/O block 160 in PLD 100 can also be varied without departing from the spirit of the present invention.

I/O pads 170 are used to allow external signals to enter PLD 100 (by way of I/O blocks 160) for processing. I/O pads 170 are also used to allow logic signals produced by PLD 100 to exit PLD 100 (also by way of I/O blocks 160) and to be applied to external circuitry. For example, as illustrated in FIG. 1, I/O blocks 160 and I/O pads 170 may be located adjacent each end of each row and adjacent each end of each column of LABs 110. In this manner, for example, programmable connections may be provided for selectively routing signals between each I/O pad 170 and selected conductors of GH channels 120 and GV channels 130 adjacent to the respective I/O blocks 160.

Figure 2:
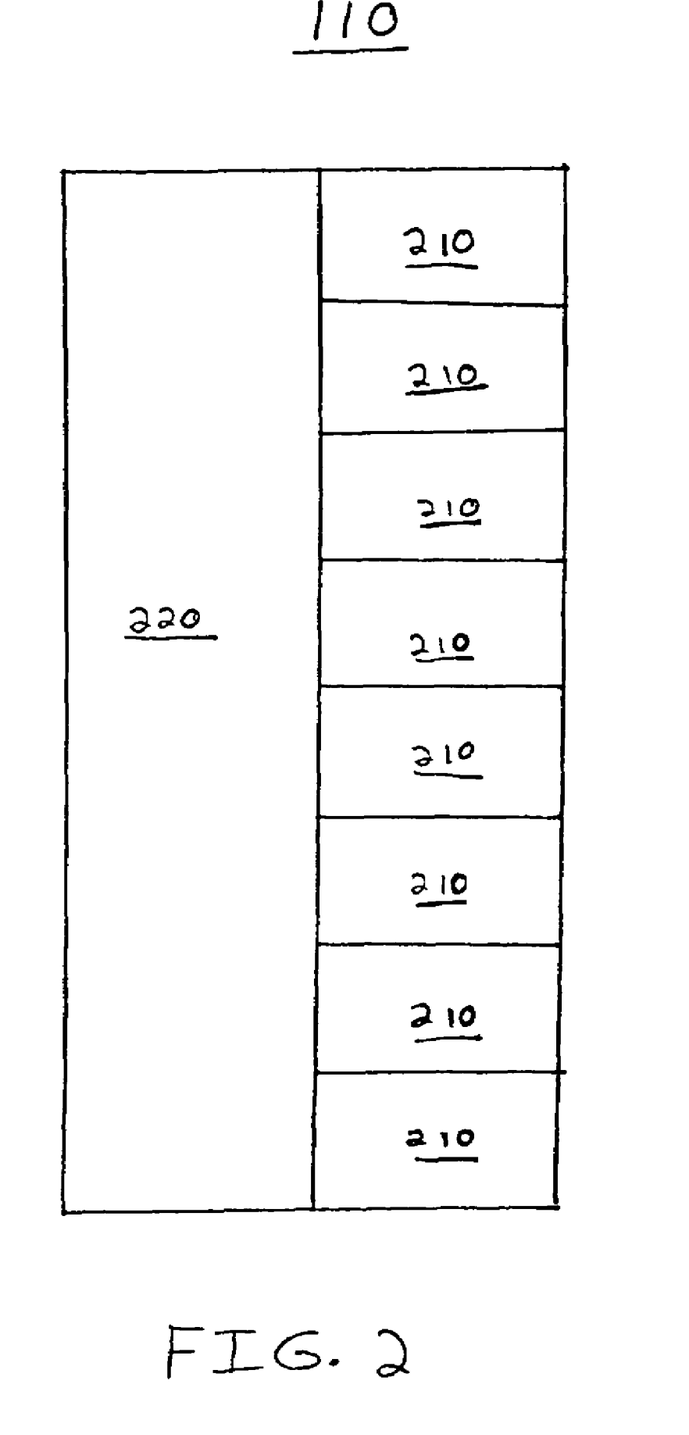
FIG. 2 is a simplified block diagram of a representative one of the logic array blocks found in the PLD of FIG. 1.

FIG. 2 shows a simplified block diagram of a representative LAB 110 including eight LEs 210. LAB 110 may also include a local (or internal) interconnect structure 220, which if available may include, for example, a local horizontal channel 150 shown in FIG. 1 or a local vertical channel (not shown). Moreover, it will be understood that while LAB 110 of FIG. 2 has eight LEs 210, a LAB according to other embodiments of the invention may have any number of LEs, including either more or less than eight LEs.

As mentioned above, LE 210 is the basic building block of a PLD. Signals external to LAB 110, such as from any of the conductors of GH channels 120 and GV channels 130, may either be programmably connected to LEs 210 through local interconnect structure 220 or may be connected through direct connections to the input pin(s) and/or output pin(s) of LE 210 (not shown). For example, each LE 210 of LAB 110 may have associated with it one LAB input multiplexer (LIM) used for routing signals from the routing interconnect of PLD 100 to LE 210. In this case, each LIM can programmably select an appropriate signal to be provided to the respective LE 210.

In one embodiment, LE 210 of the present invention incorporates a function generator that is configurable to provide a logical function of a number of variables, such a four-variable Boolean operation. The function generator may be implemented using product terms, LUTs, logic gates, logic modules, or other suitable circuitry. In addition to combinatorial functions, LE 210 may also provide support for sequential and registered functions using, for example, D flip-flops.

LE 210 provides outputs (e.g., combinatorial and/or registered outputs) that are connectable to GH channels 120 and GV channels 130, outside LAB 110. In one embodiment, output multiplexers and drivers (not shown) are used to drive these outputs of LE 210 for connection to an adjacent GH channel 120, GV channel 130, or both. In addition, the outputs from LE 210 may be internally fed back into local interconnect structure 220 such that, for example, an output from one LE 210 of LAB 110 may be programmably connected to the inputs of other LEs 210 in the same LAB 110 without using any portion of the routing architecture of PLD 100 external to LAB 110 (e.g., GH channels 120 or GV channels 130). Moreover, because local interconnect structure 220 has reduced parasitics compared to the routing architecture of PLD 100 external to LAB 110, local interconnect structure 220 generally allows signals to propagate faster than through the global interconnect structure. Using local interconnect structure 220 and/or GH channels 120 and GV channels 130, LEs 210 are programmably connectable to form larger, more complex logical functions than can be realized using a single LE 210.

Figure 3A:
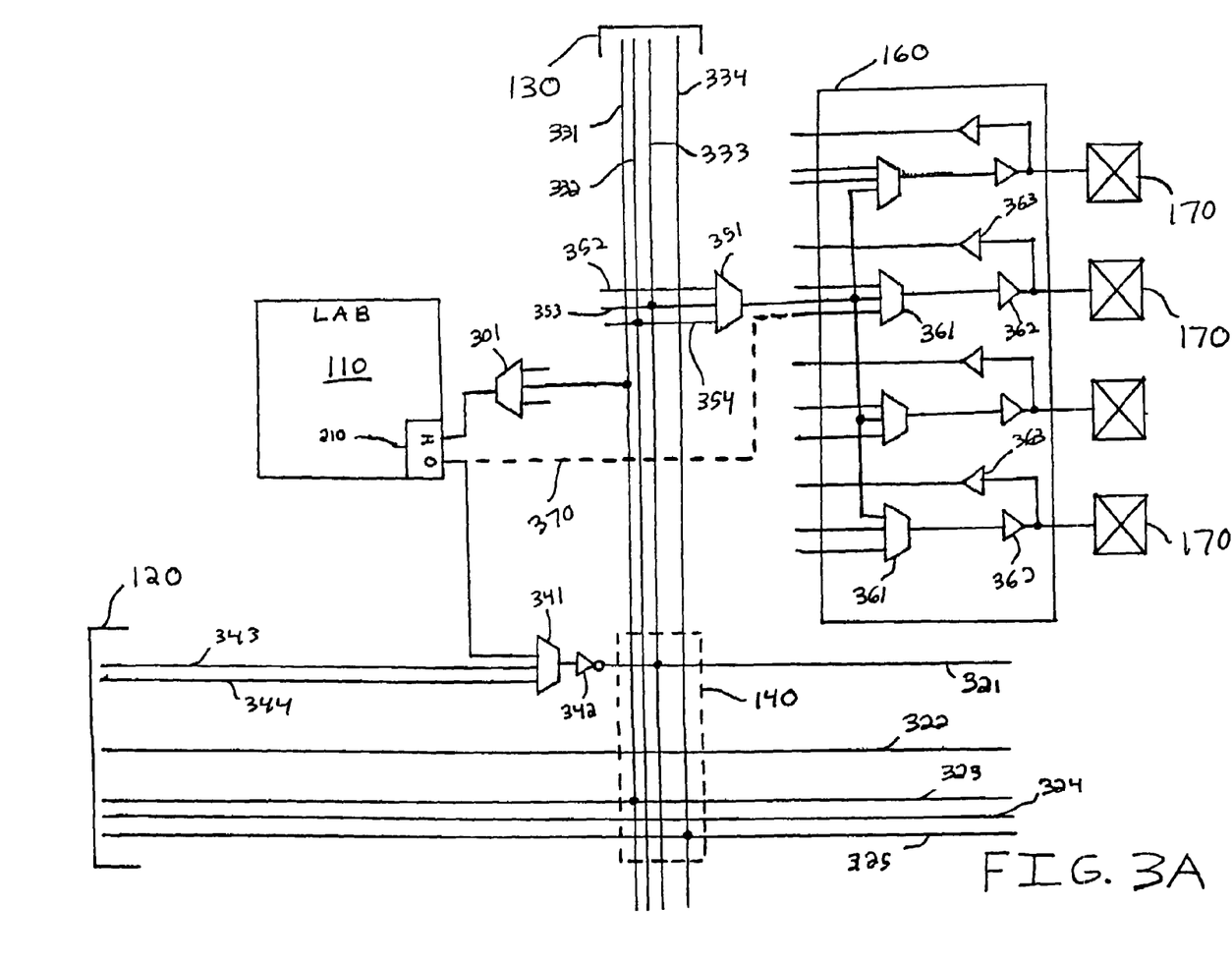
FIG. 3A is a more detailed, but still simplified, block diagram of an illustrative embodiment of a representative portion of the PLD shown in FIG. 1.

FIG. 3A is a more detailed, but still simplified, block diagram of an illustrative embodiment of a representative portion of PLD 100 shown in FIG. 1. It will be understood that many details of the representative portion of PLD 100 shown in FIG. 3A have been left out for the purpose of simplifying the description of the invention.

FIG. 3A shows a LAB 110 (e.g., the second row, third column LAB 110 from FIG. 1) having an output that is provided to an I/O pad 170 (by way of I/O block 160) in accordance with the principles of the present invention. In FIG. 3A, LAB 110 is shown to include a single LE 210 having an input pin "I" and an output pin "O." It will be understood, however, that the actual number of LEs 210 in LAB 110, as well as the number of input pins and output pins per LE 210, is not limited.

As illustrated in FIG. 3A, signal conductors 321–325 of GH channel 120 run in the horizontal direction and signal conductors 331–334 of GV channel 130 run in the vertical direction. While a particular number of horizontal signal conductors 321–325 and vertical signal conductors 331–334 are shown in FIG. 3A, it will be understood that the invention is not limited in this manner. In particular, it should be understood that GH channel 120 and GV channel 130 may respectively include any suitable number of horizontal and vertical signal conductors.

The input of LAB 110 in FIG. 3A (e.g., the input pin of LE 210) is driven by a LIM 301. For example, LIM 301 selects a signal from three inputs to provide to the input pin of LE 210. As illustrated in FIG. 3A, one of the inputs to LIM 301 may be connected to conductor 331 of GV channel 130. It will be understood, however, that the scope of the present invention is not limited by the particular inputs to LIM 301, which may come from any suitable source in the routing architecture of PLD 100.

The output of LAB 110 (e.g., the output of LE 210), meanwhile, is driven by a driver input multiplexer (DIM) 341 and a driver 342 that directly drives signal conductor 321. DIM 341 selects from any of the sources that can drive conductor 321. This includes signals from outputs of LABs (e.g., the output of LAB 110 shown in FIG. 3A), signal conductors that travel in the same direction as conductor 321, or signal conductors that are orthogonal to conductor 321. For example, signal conductor 343 shown in FIG. 3A can be used to couple the output from an adjacent LAB (not shown) to DIM 341. Alternatively, for example, signal conductor 344 can be used to couple an orthogonal conductor from a different GV channel (not shown).

Persons skilled in the art will appreciate that, while FIG. 3A illustrates the use of DIM 341 and driver 342, other suitable types of drive circuitry may be used to drive an output from LAB 110 onto the routing architecture of PLD 100. For example, in another configuration, the drive circuitry shown in FIG. 3A (or any of the remaining figures described below) can be a buffer and one or more programmable switches (e.g., pass transistors). In yet another configuration, the drive circuitry can be a multiplexer, a driver, and one more programmable switches. Moreover, it will also be understood that while FIG. 3A shows the output from LAB 110 connecting only to a single DIM 341, the output from LAB 110 may be connected to the inputs of a number of other DIMs (not shown) for driving conductors of channels other than GH channel 120.

As illustrated in FIG. 3A, I/O block 160 includes a plurality of I/O multiplexers 361, output buffers 362 and input buffers 363. It will be understood that I/O block 160 may also include other circuitry not shown in FIG. 3A. For example, I/O block 160 may also include one or more I/O registers (not shown), one or more output enable multiplexers or other types of circuitry. The invention is not limited in this manner.

Each I/O pad 170 coupled to I/O block 160 is associated with a respective I/O multiplexer 361, output buffer 362 and input buffer 363. In general, I/O block 160 and I/O pad 170 shown in FIG. 3A serve to interface output signals from LAB 110 to external, off-chip circuitry. It will be appreciated that other internal PLD signals (e.g., from other LABs 110 not shown in FIG. 3A) may be connected to external, off-chip circuitry by passing them through LAB 110, and that, for example, I/O block 160 may also feedback the output of LAB 110 to the routing architecture of PLD 100.

In operation, LAB 110 drives its output onto signal conductor 321 using DIM 341 and corresponding driver 342. In turn, this output is provided to adjacent I/O block 160 by way of signal conductors 321 and 333 and an I/O block input multiplexer (BIM) 351. It will be understood that BIM 351 is similar to LIM 301 described above, in that BIM 351 selects a signal from inputs 352–354 to provide to the input of I/O multiplexer 361. Additionally, as shown in FIG. 3A, the output of BIM 351 can be applied to more than one or each I/O multiplexer 361 of I/O block 160. The invention is not limited in this manner.

As illustrated in FIG. 3A, I/O multiplexer 361 selects one of its inputs (e.g., the output from BIM 351) and passes it through output buffer 362 to the respective I/O pad 170. In this manner, an output originating from LAB 110 may be provided to external, off-chip circuitry through I/O pad 170. It will be understood that, although not shown, output buffer 362 of I/O multiplexer 361 can receive an output enable signal (e.g., through an output enable multiplexer) which controls whether or not the output signal from I/O multiplexer 361 is provided to I/O pad 170. Moreover, as explained in greater detail below with respect to FIG. 7, external, off chip signals can also be provided to circuitry internal to PLD 100 (e.g., LAB 110), in which case these signals are received by an I/O pad 170 and passed through a respective input buffer 363.

The delays associated with routing a signal between LE 210 and I/O pad 170 in the manner described above, however, can be prohibitively large for some applications. In particular, for example, DIM 341, driver 342 and BIM 351 may introduce undesirable delays that limit the speed and thus the possible applications for which PLD 100 may be used. Therefore, in accordance with the principles of the present invention, an output bypass path 370 is provided for the routing architecture of PLD 100.

As illustrated in FIG. 3A, output bypass path 370 is used to directly connect the output of LAB 110 to adjacent I/O block 160. In particular, output bypass path 370 provides a faster connection between the output of LAB 110 and I/O multiplexer 361 than is otherwise possible because the delays associated with a signal traveling through DIM 341 and BIM 351, for example, are avoided. While using output bypass path 361 limits the connections of the output of LAB 110 to only a single I/O multiplexer 361 (rather than each I/O multiplexer as is possible when BIM 351 is not bypassed), the versatility of the routing architecture of PLD 100 prevents such a limitation from presenting major problems.

Figure 3B:
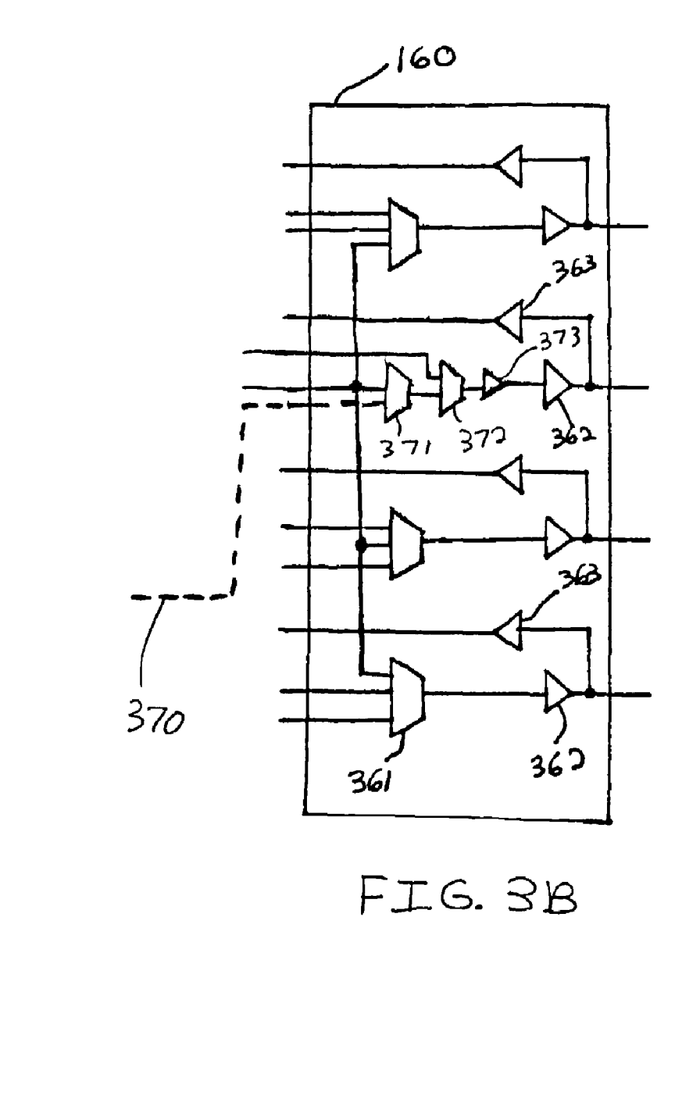
FIG. 3B is a simplified block diagram of an alternate embodiment of the I/O block 160 shown in FIG. 3A.
Figure 3C:
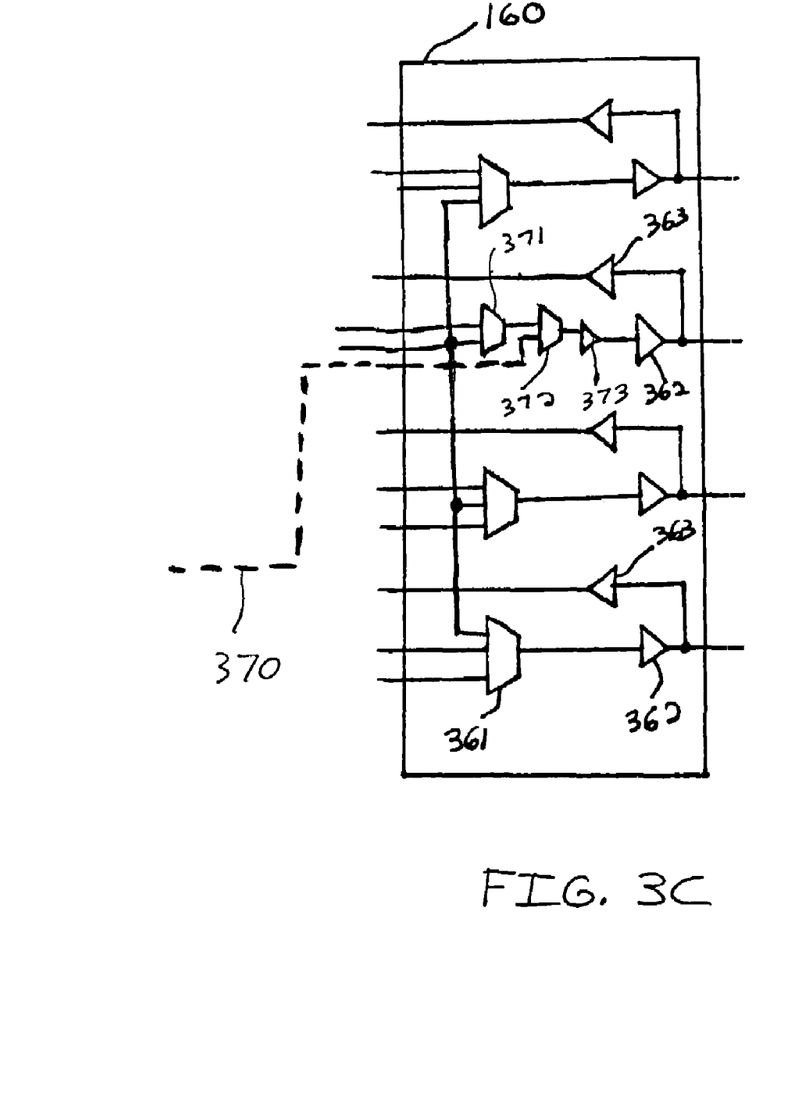
FIG. 3C is a simplified block diagram of yet another embodiment of the I/O block 160 shown in FIG. 3A.

It should be noted that although I/O block 160 is shown in FIG. 3A to use a single I/O multiplexer 361 for providing a signal to I/O pad 170 through output buffer 362, the invention is not limited in this manner. For example, as shown in FIGS. 3B–3C, I/O block 160 could use a pair of I/O multiplexers 371 and 372 and an optional buffer delay 373. In this case, output bypass path 370 can connect directly to either I/O multiplexer 371, as shown in FIG. 3B, or directly to I/O multiplexer 372, as shown in FIG. 3C. Moreover, it will be understood that I/O block 160 can use any other suitable number of I/O multiplexers, in any combination of series and parallel connections, and that output bypass path 370 can be connected to any one of these multiplexers without departing from the spirit of the present invention.

Figure 4:
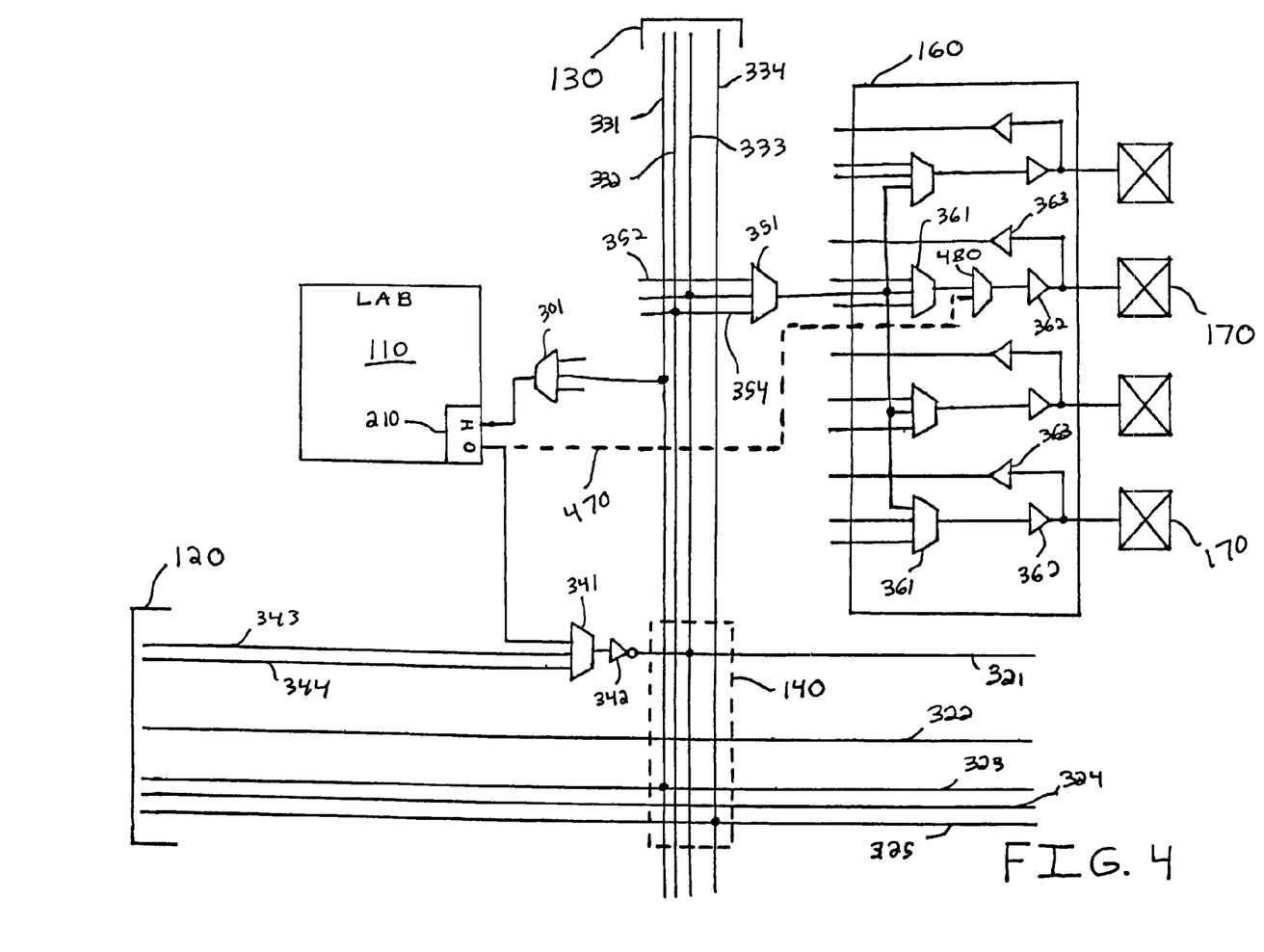
FIG. 4 is a more detailed, but still simplified, block diagram of another illustrative embodiment of a representative portion of the PLD shown in FIG. 1.

FIG. 4 is a more detailed, but still simplified, block diagram of another illustrative embodiment of a representative portion of the PLD shown in FIG. 1. In particular, FIG. 4 is substantially similar to the embodiment shown in FIG. 3A. However, instead of using an output bypass path 370 that simply bypasses DIM 341 and BIM 351, the output bypass path 470 of FIG. 4 also bypasses I/O multiplexer 361 of I/O block 160.

As illustrated in FIG. 4, the output of LAB 110 is connected directly to bypass multiplexer 480 by way of output bypass path 470. Bypass multiplexer 480, meanwhile, selects for its output either of its two inputs (e.g., the output of I/O multiplexer 480 or output bypass path 470). In this manner, as with the embodiment shown in FIG. 3A, the delays associated with a signal traveling through DIM 341 and BIM 351, for example, are avoided. In addition, in the embodiment shown in FIG. 4, the delay associated with I/O multiplexer 361 of FIG. 3A (or I/O multiplexers 371–372 of FIGS. 3B–3C) is also avoided (at the expense of requiring an additional component, bypass multiplexer 480, which generally requires less space and has a smaller delay associated with it).

Persons skilled in the art will appreciate that output bypass paths 370 and 470 of PLD 100 may be used to provide fast direct connections to an I/O block 160 for data outputs as well as other types of signals. For example, in addition to providing fast data signals, the output bypass paths according to the invention can also be used to provide output enable signals in a number of different ways.

Figure 5A:
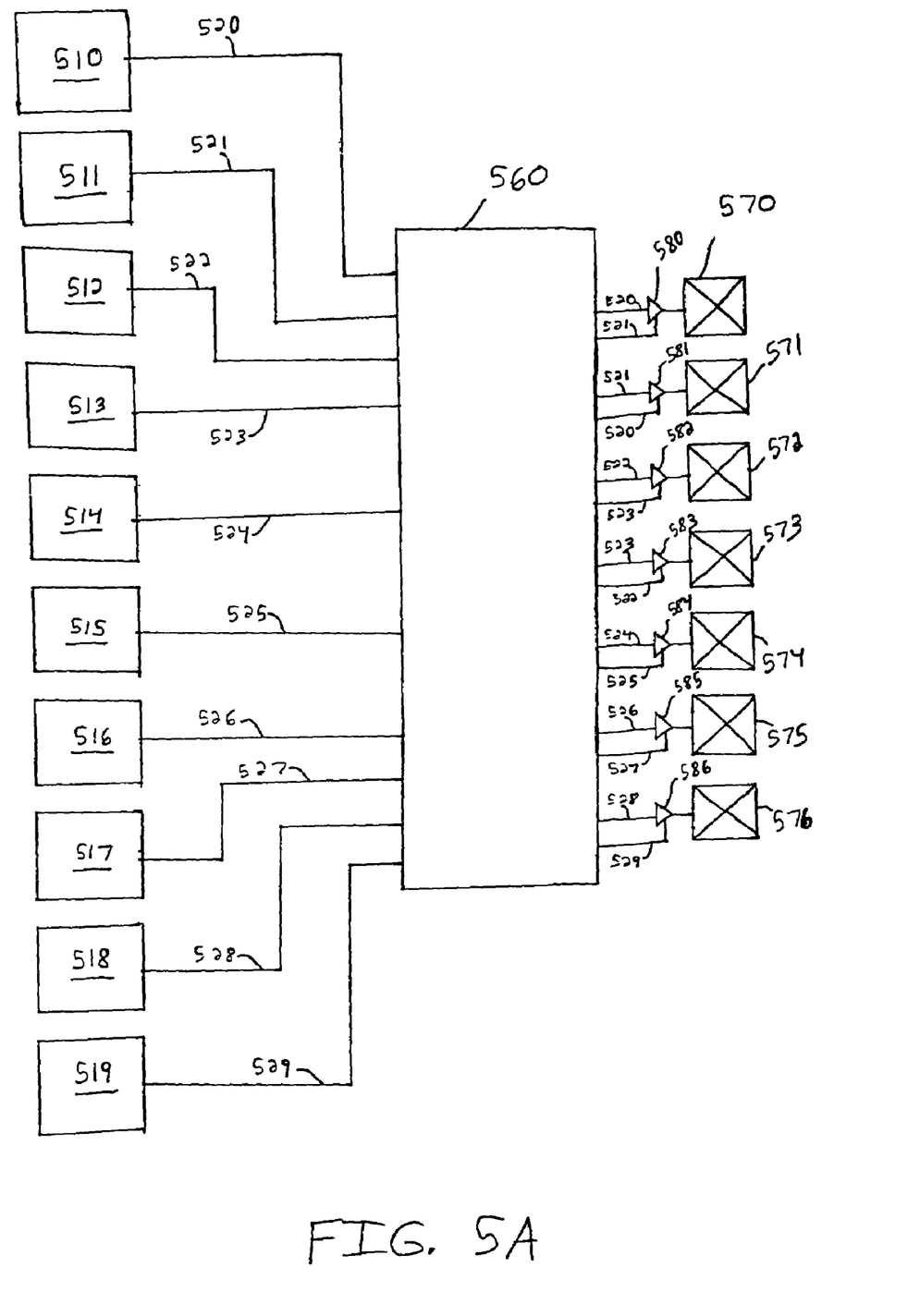
FIG. 5A is a simplified block diagram of an illustrative embodiment of a representative portion of a PLD in accordance with the principles of the present invention.

For illustrative purposes, FIG. 5A shows ten LEs 510–519 that provide output bypass paths 520–529, respectively, to I/O block 560. It will be understood that each of LEs 510–519 can be similar to, for example, output bypass path 370 described above in connection with FIGS. 3A–3C or output bypass path 470 described above in connection with FIG. 4. Persons skilled in the art should also appreciate that, although not shown in detail, I/O block 560 can be similar to I/O block 160 as described in connection with any of FIGS. 3A–3C and FIG. 4, and can also contain additional components (e.g., multiplexers, buffers and the like).

As illustrated in FIG. 5A, each of the I/O pads 570–576 is associated with a respective one of output enable components 580–586, which can each be any suitable type of component (e.g., a switch) that selectively permits the passage of data signals from originating from LEs 510–519. In operation, output bypass path 520 of FIG. 5A is used to provide a fast connection between the output of LE 510 and both the data input for I/O pad 570 and the output enable input for component 581 associated with I/O pad 571. Meanwhile, output bypass path 521 provides a fast connection between the output of LE 511 and both the data input for I/O pad 571 and the output enable input for component 580 associated with I/O pad 570. Similarly, output bypass paths 522 and 523 are used to provide fast data and output enable signals to I/O pads 572–573 and components 582–583. Each of the remaining output bypass paths 524–529, meanwhile, are used to provide a respective one of the fast data and output enable signals to I/O pads 574–576 and components 584–586 as illustrated in FIG. 3A. In this manner, a PLD using the components shown in FIG. 5A can be programmed such that any given I/O pad 570–576 (and associated components 580–586) receive both a fast data output signal and a fast output enable signal, even though there is not twice as many output bypass paths 520–529 as I/O pads 570–576.

Figure 5B:
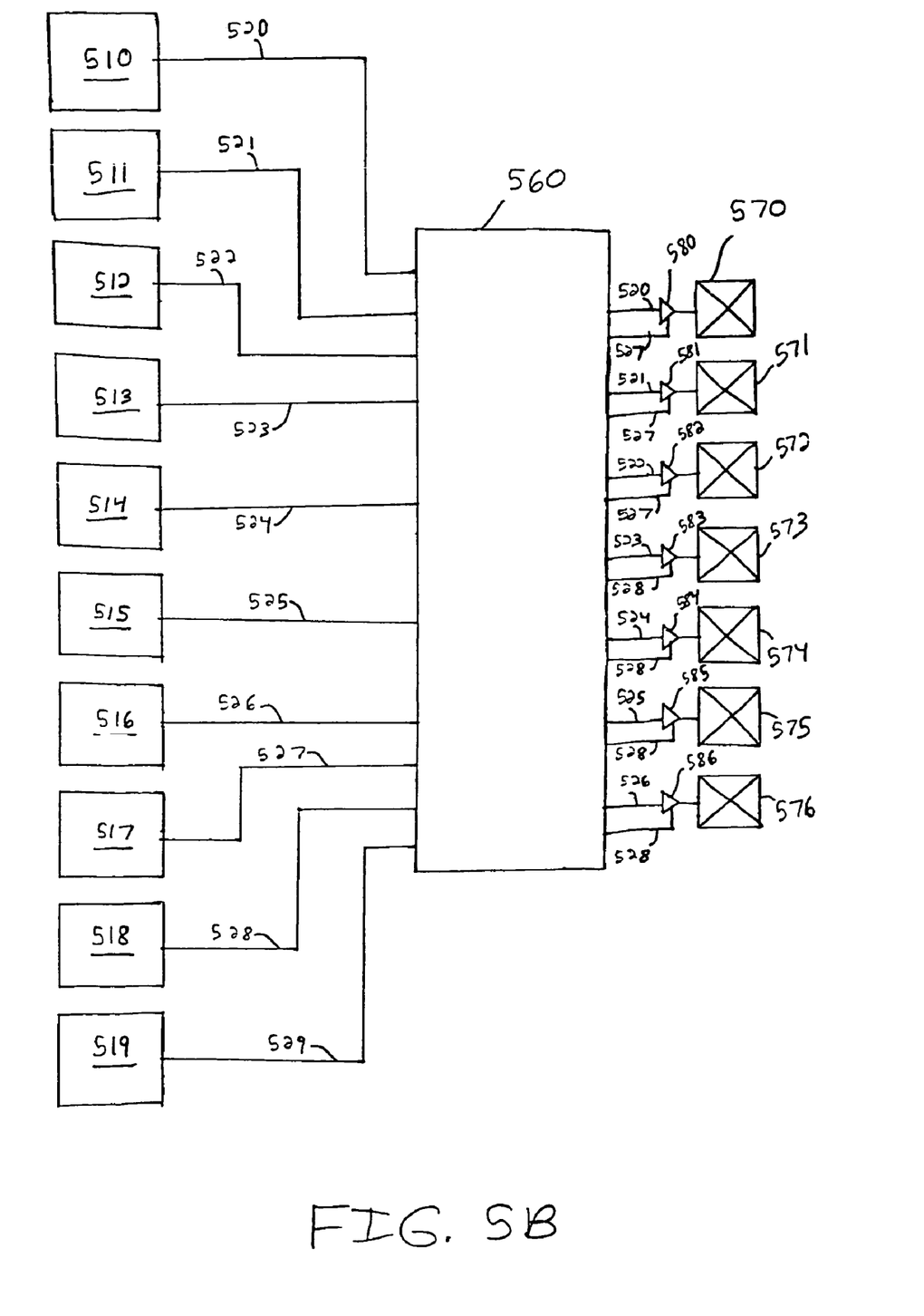
FIG. 5B is a simplified block diagram of another illustrative embodiment of a representative portion of a PLD in accordance with the principles of the present invention.

FIG. 5B shows another embodiment of the present invention that is similar to the embodiment of FIG. 5A. In the embodiment of FIG. 5B, however, output bypass paths 520–526 are used to provide the fast data outputs to I/O pads 570–576, respectively. Meanwhile, as shown in FIG. 5B, output bypass path 527 provides a fast output enable signal to components 580–582, while output bypass path 528 provides a fast output enable signal to components 583–586. In this embodiment, the output from LE 519 is not used.

The above two examples are for illustrative purposes only, and it will be understood that any one of the output bypass paths 520–529 of LEs 510–519 can be used to drive any combination of the data outputs or output enables of any of the I/O pads 571–576 and components 580–586. The invention is not limited in this manner.

In addition to providing fast output paths, such as described above in connection with output bypass paths 370, 470 and 520–529, bypass paths can also be used in accordance with the principles of the present invention to provide faster connections onto a chip from external circuitry. The use of such input bypass paths is now described in connection with the use of segmented signal conductors in the routing architecture of PLD 100.

As mentioned above, a PLD according to the invention may include segmented conductors spanning a specific number of LABs 110, in place of or in addition to the conductors of GH channels 120 and GV channels 130 which span an entire row or column of LABs 110. For example, the segmented conductors may be H4 conductors that programmably connect four LABs 110 in a given row.

Figure 6:
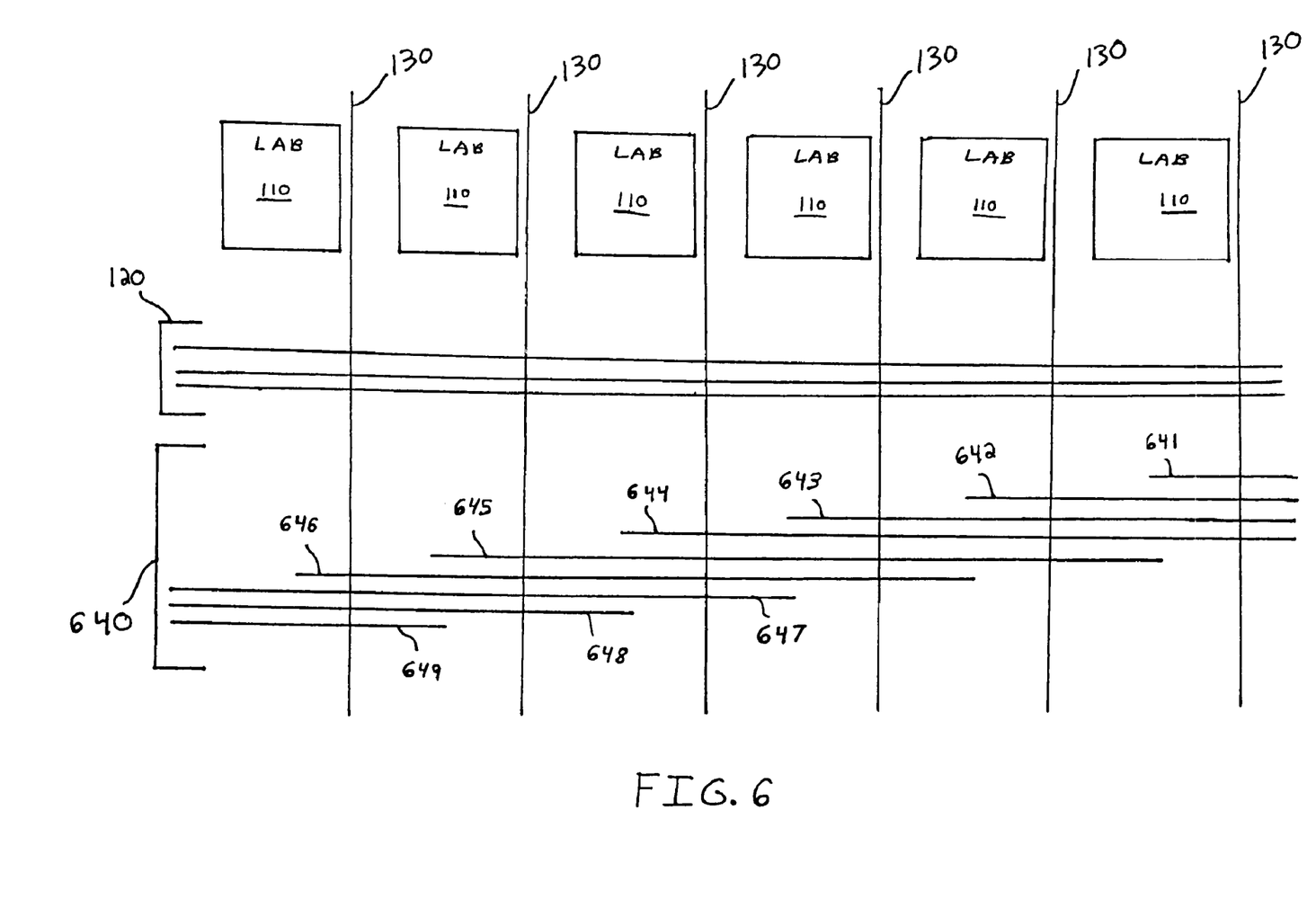
FIG. 6 is a more detailed, but still simplified, block diagram of yet another illustrative embodiment of a representative portion of the PLD shown in FIG. 1.

FIG. 6 shows a segmented conductor channel 640 which includes a plurality of shorter horizontal conductors 641–649. As illustrated in FIG. 6, the starting (and ending) points of shorter horizontal conductors 641–649 are staggered uniformly along the length of the row of LABs 110. This enhances routability, given that each LAB 110 in PLD 100 can then reach three other LABs 110 in either direction using only one conductor. For example, the third LAB 110 from the left in FIG. 6 can drive signals onto conductor 644, which is directly accessible by the three LABs 110 to its right. Similarly, the same LAB 110 could drive signals onto conductor 647 to reach three LABs 110 to its left.

It will be understood that, although a particular configuration of nine shorter horizontal conductors 641–649 are shown in FIG. 6, the invention is not limited in this manner. For example, an additional (redundant) shorter horizontal conductor (not shown) can be used for interconnecting the same four LABs as shorter horizontal interconnect 645. Additionally, in place of H4 conductors, conductors of other sizes can also be used. For example, one or more of shorter horizontal interconnects 641–649 many extend one quarter of the length of the associated row of LABs 110. Thus, on the assumption that there are 24 LABs 110 in the row, each of these shorter horizontal conductors would extend to six adjacent LABs 110. Moreover, it should also be understood that routing architecture of PLD 100 may also include shorter vertical conductors (e.g., V4 conductors) in place of or in addition to the conductors of GV channels 130 without departing from the scope of the present invention.

Figure 7:
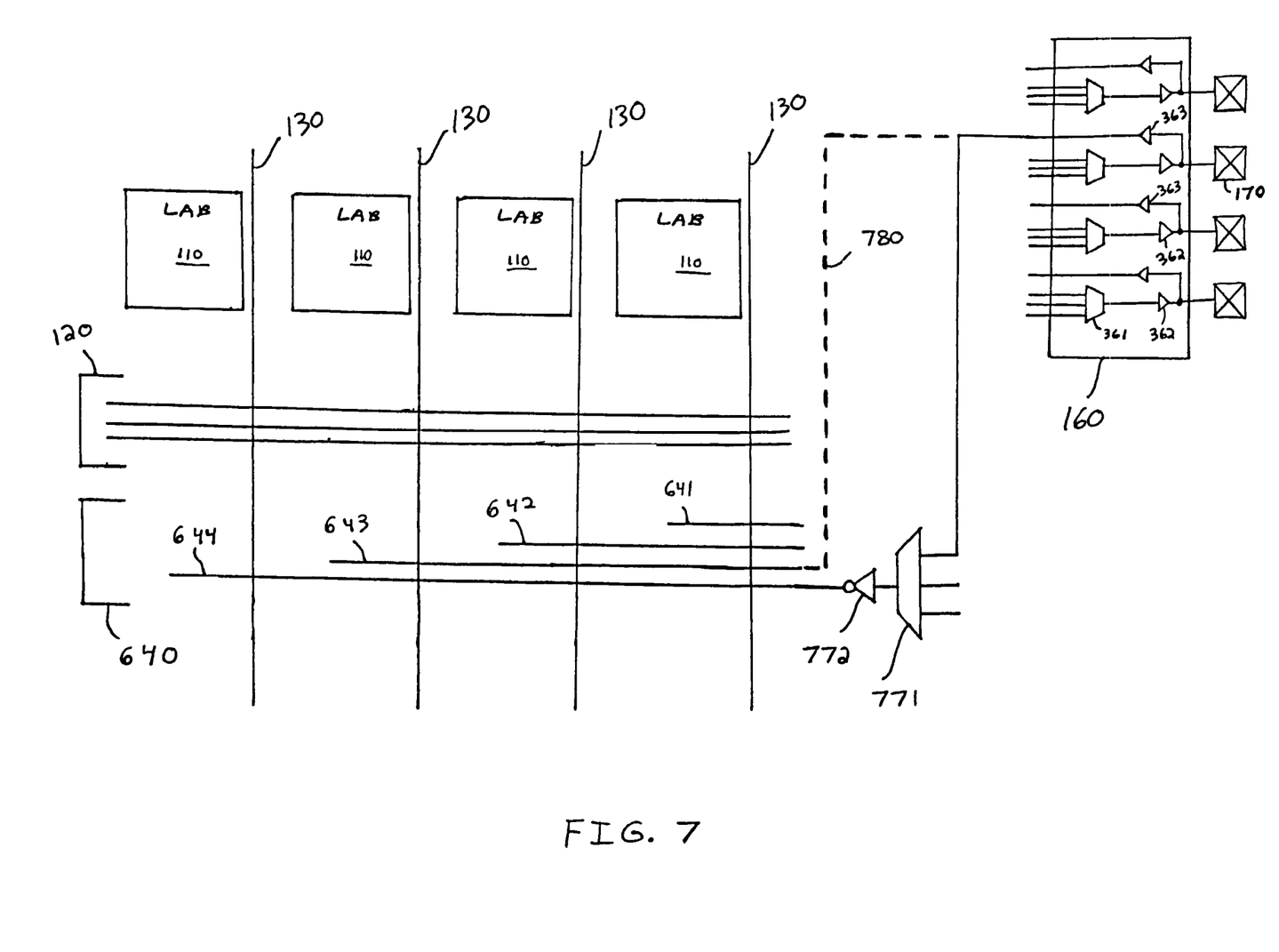
FIG. 7 is a more detailed, but still simplified, block diagram of still another illustrative embodiment of a representative portion of the PLD shown in FIG. 1.

FIG. 7 shows a simplified block diagram of an illustrative embodiment of a representative portion of PLD 100 shown in FIG. 1 which demonstrates the manner in which I/O blocks 160 of PLD 100 may facilitate the passage of external, off chip signals applied to I/O pads 170 to circuitry internal to PLD 100. In operation, I/O block 160 of FIG. 7 receives a signal from I/O pad 170. After passing through an input buffer 363 associated with the I/O pad 170, the signal is provided to one or more portions of the routing architecture of PLD 100 (e.g., to one or more of the conductors of a GH channel 120 or GV channel 130, to one or more segmented conductors of a segmented conductor channel 640, or any combination thereof).

As illustrated in FIG. 7, the output of I/O block 160 may be driven by DIM 771 and driver 772 (which can be similar to DIM 341 and driver 342 described above, respectively) onto shorter horizontal conductor 644. While another conductor may be driven by DIM 771 and driver 772, shorter horizontal conductor 644 is typically selected from the conductors of segmented conductor channel 640 because it has the longest reach (which, in the embodiment shown in FIG. 7, is four LABs 110).

It will be understood that, by implementing the conductors of segmented conductor channel 640 in a staggered fashion, partial, or dangling conductors at the routing architecture boundary are created (as illustrated in FIG. 7). In accordance with the principles of the present invention, an input bypass path 780 is used to provide a direct connection between an input buffer 363 of I/O block 160 and a dangling conductor 643. In this manner, shorter horizontal conductor 643 is driven directly by input buffer 363, allowing a signal to get into the routing architecture of PLD 100 without incurring any of the delays associated with DIM 771 and driver 772. Additionally, because the dangling wires are already there, there is no area impact on PLD 100.

In other embodiments of the invention, input bypass path 780 may be used to drive a wire other than shorter horizontal conductor 643. For example, instead of driving conductor 643, input bypass path 780 could be used to drive shorter horizontal conductor 641. Alternatively, more than one input bypass path may be used such that multiple dangling interconnects can be directly driven. The invention is not limited in this manner.

Figure 8:
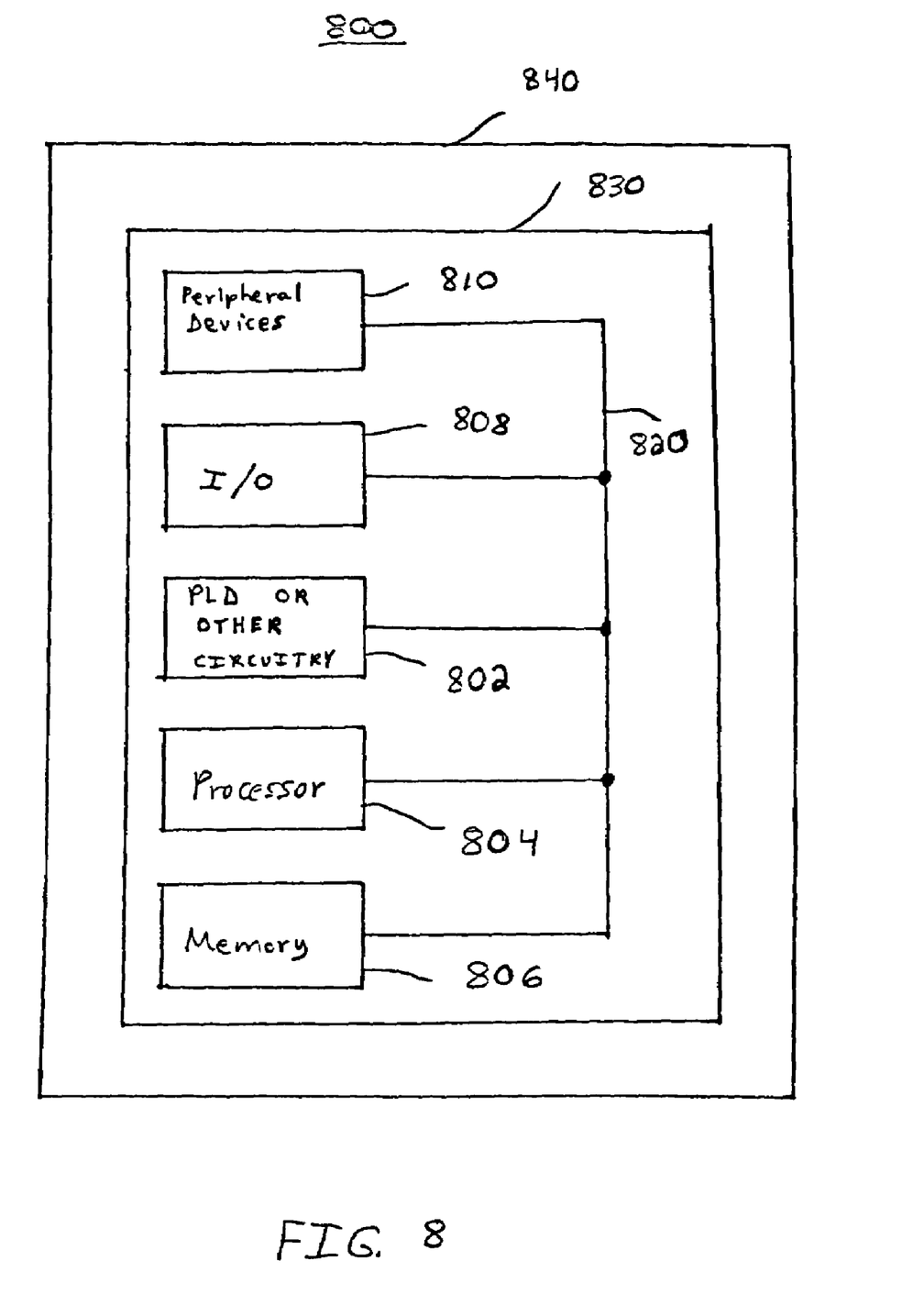
FIG. 8 is a simplified block diagram of an illustrative system employing a PLD according to the principles of the present invention.

It will be understood that PLD circuits, such as described above, have many possible applications. FIG. 8 illustrates a data processing system 800 which includes a PLD or other circuitry 802 in accordance with this invention. Data processing system 800 may include one or more of the following components: a processor 804; memory 7806; I/O circuitry 808; and peripheral devices 810. These components are coupled together by a system bus or other interconnections 820 and are populated on a circuit board 830 that is contained in an end-user system 840.

System 800 can be used in a wide variety of applications, such as computer networking, data networking, instrumentation, video processing, digital signal processing, or any other application. Circuitry 802 may be used to perform a variety of different logic functions. For example, circuitry 802 may be configured as a processor or controller that works in cooperation with processor 804. Circuitry 802 may also be used as an arbiter for arbitrating access to a shared resource in system 800. In yet another example, circuitry 802 can be configured as an interface between processor 804 and one of the other components in system 800.

It should be noted that the foregoing description of the invention, including system 800, is only exemplary, and is not meant to limit the scope of the invention. For example, while the output bypass paths described above have been described in connection with the routing of data signals and output enable signals to an I/O block, these paths can also be used to provide fast connections for other signals as well. For example, bypass paths according to the invention may also be used to provide clear and/or preset signals to an I/O register, enable and/or clock signals to an external phase-locked loop circuit, read and/or write controls to a memory controller, and the like.

Additionally, for example, various technologies (e.g., EPROMs, EEPROMs, pass transistors, transmission gates, antifuses, laser fuses, metal optional links, mask programmability and function control registers) can be used to implement PLDs such as the one shown in FIG. 1. The invention is not limited in this manner. Moreover, as explained above, LABs 110 and the conductors of the routing architecture for PLD 100 need not be organized as shown in FIGS. 1–6 and described above. For example, any suitable number of rows and columns of LABs can be organized in a PLD according to the principles of the present invention. This includes an arrangement of 1-by-N LABs in a PLD, where N is an integer.

The above described embodiments of the present invention are presented for purposes of illustration and not of limitation, and the present invention is limited only by the claims which follow.

What is claimed is:

1. A programmable logic device comprising:
   a plurality of logic elements (LEs) for performing logic functions that are arranged in one or more logic array blocks (LABs);
   at least one input/output (I/O) block for passing signals between said LEs and one or more I/O pads associated with said I/O block, said I/O pads providing input and output to said programmable logic device; and
   a signal routing architecture for routing signals among said LEs and said at least one I/O block comprising:
      a plurality of horizontal and vertical signal routing conductors and drive circuitry;
      at least one block input multiplexer for selectively providing signals from said plurality of horizontal and vertical signal routing conductors to said at least one I/O block; and
      at least one output bypass path for providing a direct connection between an output from one of said plurality of LEs and said at least one I/O block,
   wherein said at least one output bypass path does not travel through a multiplexer between said plurality of LEs and said at least one I/O block.

2. The programmable logic device of claim 1 wherein said at least one output bypass path is used for routing a data signal.

3. The programmable logic device of claim 1 wherein said at least one output bypass path is used for routing an output enable signal.

4. The programmable logic device of claim 1 wherein said at least one output bypass path is used for routing signals to an I/O register.

5. The programmable logic device of claim 1 wherein said at least one output bypass path is used for routing signals to an external phase-locked loop circuit.

6. The programmable logic device of claim 1 wherein said at least one output bypass path is used for routing signals to a memory controller.

7. The programmable logic device of claim 1 wherein said at least one I/O block comprises at least one I/O multiplexer, said output bypass path being coupled to one of the inputs of said at least one I/O multiplexer.

8. The programmable logic device of claim 7 wherein said at least one I/O block further comprises at least one output buffer, the output of said at least one I/O multiplexer being coupled through said output buffer to one of said I/O pads.

9. The programmable logic device of claim 7 wherein said at least one I/O block further comprises one or more I/O registers.

10. The programmable logic device of claim 7 wherein said at least one I/O block further comprises one or more output enable multiplexers.

11. The programmable logic device of claim 1 wherein said at least one I/O block comprises:
    an I/O multiplexer;
    a bypass multiplexer receiving as one of its inputs the output of said I/O multiplexer, wherein said output bypass path is coupled to another of the inputs of said bypass multiplexer; and
    an output buffer, wherein the output of said bypass multiplexer is coupled through said output buffer to one of said I/O pads.

12. The programmable logic device of claim 1 wherein said LABs are arranged in a one dimensional array.

13. The programmable logic device of claim 1 wherein said LABs are arranged in a two dimensional array.

14. The programmable logic device of claim 1 wherein said drive circuitry comprises a driver input multiplexer (DIM) and a driver.

15. The programmable logic device of claim 1 wherein said drive circuitry comprises a buffer and one or more programmable switches.

16. The programmable logic device of claim 15 wherein said one or more programmable switches are pass transistors.

17. The programmable logic device of claim 1 wherein said drive circuitry comprises:
    a multiplexer;
    a driver; and
    one more programmable switches.

18. A digital processing system comprising:
    processing circuitry;
    a memory coupled to said processing circuitry; and
    a programmable logic device as defined in claim 1 coupled to the processing circuitry and the memory.

19. A printed circuit board on which is mounted a programmable logic device as defined in claim 1.

20. The printed circuit board defined in claim 19 further comprising:
    memory circuitry mounted on the printed circuit board and coupled to the programmable logic device.

21. The printed circuit board defined in claim 20 further comprising:
    processing circuitry mounted on the printed circuit board and coupled to the memory circuitry.

22. An integrated circuit device comprising the programmable logic device of claim 1.

23. A digital processing system comprising:
    processing circuitry;
    a memory coupled to said processing circuitry; and
    an integrated circuit device as defined in claim 22 coupled to the processing circuitry and the memory.

24. A printed circuit board on which is mounted an integrated circuit device as defined in claim 22.

25. The printed circuit board defined in claim 24 further comprising:
    memory circuitry mounted on the printed circuit board and coupled to the integrated circuit device.

26. The printed circuit board defined in claim 25 further comprising:
    processing circuitry mounted on the printed circuit board and coupled to the memory circuitry.

27. A programmable logic device comprising:
a plurality of programmable logic circuits;
an I/O circuit;
programmable interconnection circuitry for selectively conveying signals between the logic circuits;
programmable routing circuitry for programmably selecting from any of a plurality of signals in the interconnection circuitry a signal for application to the I/O circuit; and
programmable bypass circuitry for selectively conveying a signal from one of the logic circuits to the I/O circuit in lieu of a signal from the routing circuitry without traveling through programmable routing circuitry between said plurality of LEs and said at least one I/O block.

28. A programmable logic device comprising:
a plurality of logic elements (LEs) for performing logic functions that are arranged in one or more logic array blocks (LABs);
at least one input/output (I/O) block for passing signals between said LEs and one or more I/O pads, said I/O pads providing input and output to said PLD; and
a signal routing architecture for routing signals among said LEs and said at least one I/O block comprising:
  a plurality of segmented routing conductors and drive circuitry;
  at least one driver input multiplexer for selectively providing signals from said at least one I/O block to one or more of said plurality of segmented routing conductors; and
  at least one input bypass path for providing a direct connection between said at least one I/O block and one of said plurality of segmented routing conductors dangling at the boundary of said routing architecture.

29. The programmable logic device of claim 28 wherein said at least one I/O block comprises an input buffer, said input bypass path providing a direct connection between said input buffer and said one of said plurality of segmented routing conductors.

30. A method of increasing the speed of a programmable logic device comprising:
configuring a plurality of logic elements (LEs) for performing logic functions in one or more logic array blocks (LABs); and
using a signal routing architecture that comprises at least one block input multiplexer for routing signals among said LEs and at least one I/O block, said signal routing architecture providing at least one direct connection between an output from one of said LEs and said at least one I/O block, wherein said at least one direct connection does not travel through a multiplexer between said LEs and said at least one I/O block.

31. A method of increasing the speed of a programmable logic device comprising:
configuring a plurality of logic elements (LEs) for performing logic functions in one or more logic array blocks (LABs);
using a signal routing architecture that comprises a plurality of segmented routing conductors for routing signals among said LEs and at least one I/O block, said signal routing architecture comprising at least one driver input multiplexer for selectively providing signals from said at least one I/O block to at least one of said plurality of segmented routing conductors; and
providing at least one direct connection between said at least one I/O block and one of said plurality of segmented routing conductors dangling at the boundary of said routing architecture.

* * * * *